United States Patent [19]
Van Brunt

[11] 4,357,703
[45] Nov. 2, 1982

[54] TEST SYSTEM FOR LSI CIRCUITS RESIDENT ON LSI CHIPS

[75] Inventor: Nicholas P. Van Brunt, White Bear Lake, Minn.

[73] Assignee: Control Data Corporation, Minneapolis, Minn.

[21] Appl. No.: 195,697

[22] Filed: Oct. 9, 1980

[51] Int. Cl.³ .................... G01R 31/28; G06F 11/00
[52] U.S. Cl. .................................. 371/15; 324/73 R
[58] Field of Search ............... 371/15, 67, 68; 324/73 R, 73 AT, 73 PC

[56] References Cited

U.S. PATENT DOCUMENTS

| | | | |
|---|---|---|---|
| 3,614,608 | 10/1971 | Giedd et al. | 324/73 R |
| 3,723,868 | 3/1973 | Foster | 324/73 AT |
| 3,777,129 | 12/1973 | Mehia | 324/73 R X |
| 3,927,371 | 12/1975 | Pomeranz et al. | 324/73 R |
| 4,176,258 | 11/1979 | Jackson | 364/68 |
| 4,244,048 | 1/1981 | Tsui | 371/15 |

OTHER PUBLICATIONS

Eichelberger et al., "A Logic Design Structure for LSI Testability", *J. of Design Automation & Fault Tolerant Computing*, vol. 2, No. 2, May 1978, pp. 165–178.

*Primary Examiner*—David H. Malzahn
*Attorney, Agent, or Firm*—William J. McGinnis, Jr.

[57] ABSTRACT

A test system performs dynamic testing of complex logic modules at full system clock rates and is resident on each LSI chip under test. The system logic is designed to be included on each LSI chip to reduce the time and computation required to detect and isolate faults in systems built from one or more chips. The on chip system includes switchable transmission gates to alter logic paths, a control shift register in the test function, an input shift register, an associated test generator and accumulator, an output shift register and an associated generator and accumulator. This logic provides test operands for the logic function under test and analyzes the resultant operands. Test operands are produced using a shift register connected to all inputs of the logic function under test. Checksum logic together with a shift register produce a running checksum of all output states of the module under test at the operative clock rate of the LSI.

4 Claims, 3 Drawing Figures

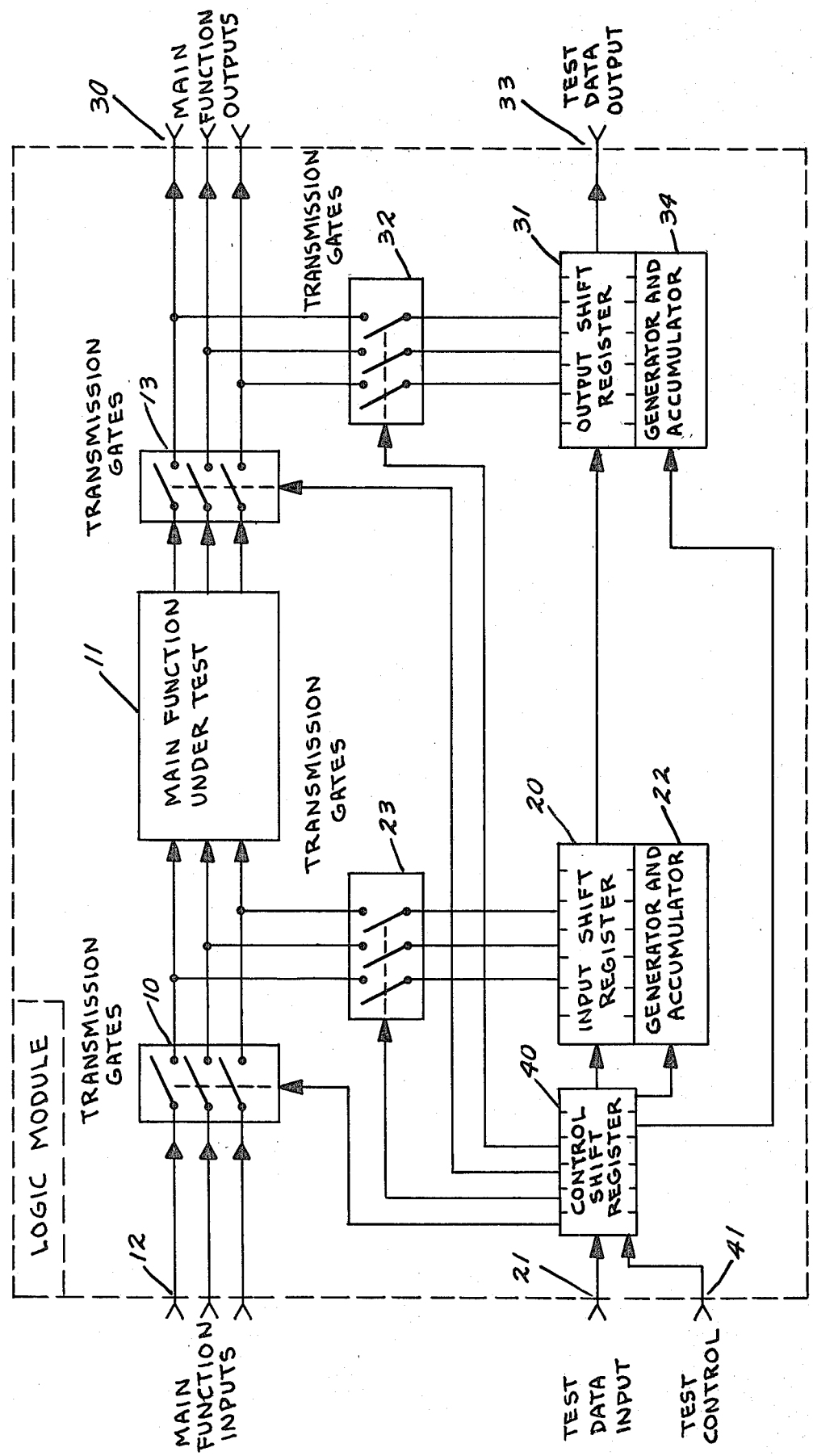

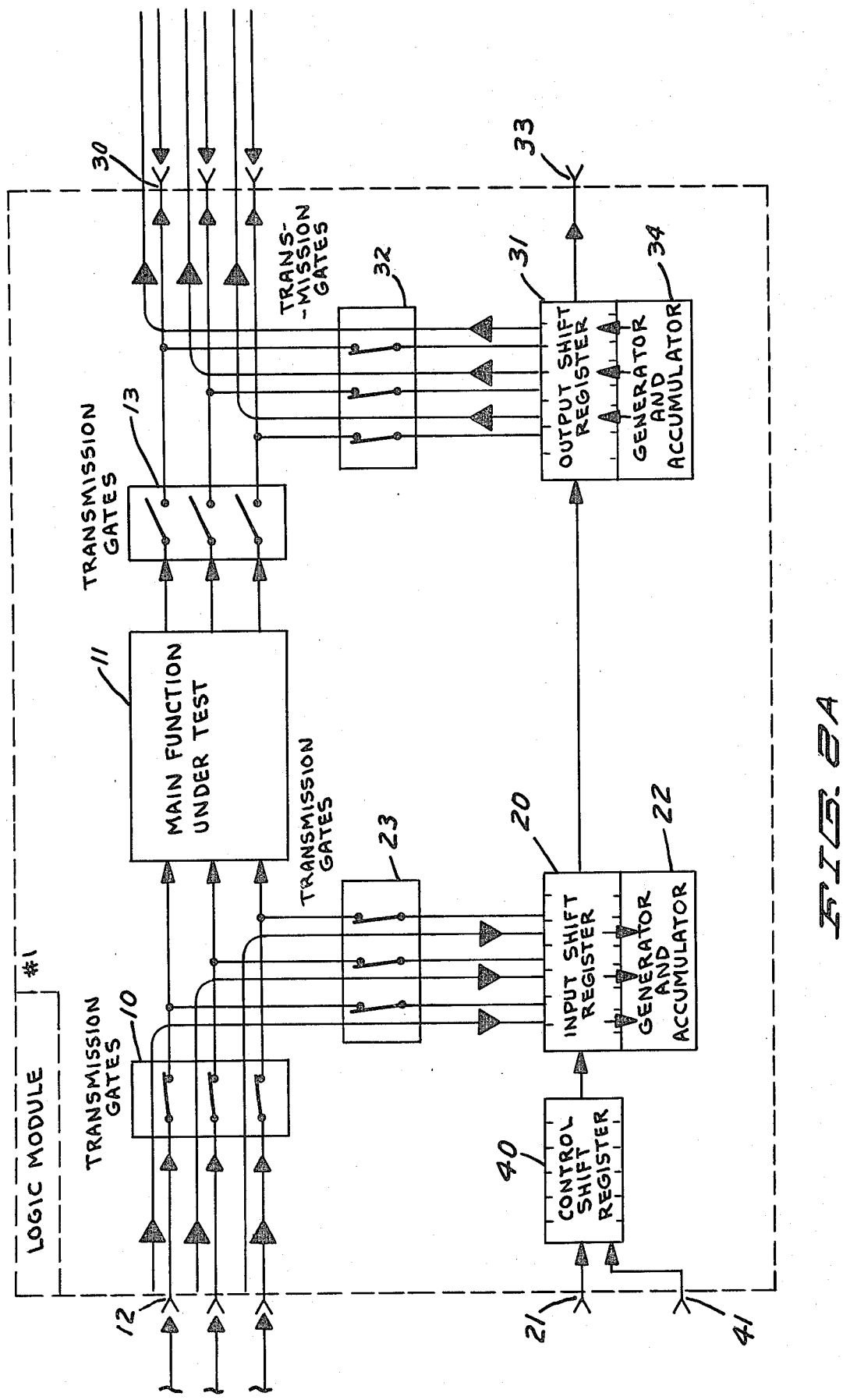

TEST SYSTEM FOR LSI CIRCUITS RESIDENT ON LSI CHIPS

BACKGROUND OF THE INVENTION

This invention relates to test systems for complex LSI (Large Scale Integrated) circuit chips found in the state-of-the-art digital electronics systems. The provision of on chip logic module testing reduces the number of input and output terminations to the device and facilitates a complete test function of the module. The additional logic to be placed on such an LSI chip as a result of the internal test function is more easily accommodated than the requirements necessary to provide for external testing.

Problems relating to the testing of individual LSI chips or complete systems built from complex LSI technology developed because of the large number of test operands needed to provide good chip test coverage. If the test operands are applied by conventional methods through input pins and analyzed through the output of the chip, the test time becomes long and expensive. Also, the job of determining a valid set of complete test operands becomes an additional burden which is difficult and in fact becomes impractical for complex chips. Further, in the test environment where mechanical connection of electrical test equipment must be made to a large number of pin contacts for both input and output functions, is the unreliability and difficulty of duplicating good electrical contacts. Thus, a failed electrical contact will show as a defect in the testing procedure even where the chip can be good. Further, mechanical access to an LSI chip in a testing environment is difficult where test signals may be sampled from particular input and output pins of a chip in the system test environment. Thus, pin testing of LSI chips in the final system must be avoided.

Particularly difficult is the testing of logic on chips at the silicon wafer stage of manufacture. The cost of packaging requires testing on the wafer. Because the difficulty of obtaining good connections to over 100 pins on a wafer is so high, a test system reducing pin connections is particularly useful.

Known to applicant in the prior art is an article entitled "A Logic Design Structure for LSI Testability" by E. B. Eichelberger and T. W. Williams published in the *Journal of Design Automation and Fault Tolerant Computing*, Vol. 2, No. 2, May 1978, pp. 165–178. The paper shows a two-step design method for creating testable LSI chips. The first step is designed of sequential logic structures so that operation is not dependent on signal rise and fall times or on circuit transmission delays. The second step of the design process disclosed is to design all internal storage elements so that they can be operated as shift registers to facilitate testing and diagnostic functions. The point is that sequential logic can be transformed to combinational logic functions which are easier to test. While this paper gives an excellent background and references to state-of-the-art LSI chip testing, the paper does not show the use of independent shift registers and checksum logic systems as described in the present invention for designing LSI chip test systems.

U.S. Pat. Nos. 3,777,129 and 3,927,371 are also known to applicant. These patents show that the concept of having test related circuitry on an LSI chip is, by itself, old. These patents also show that LSI chips may be tested by using various signal input combinations which do not necessarily represent a specific checklist of exact functions to be performed. The present invention employs the concept of using signal input test combinations which do not necessarily represent the exact functions to be performed by the logic module. These patents are however distinguished from the present invention in that the combination of a logic, shift registers, checksum devices and control circuits provided in the present invention are not anticipated by the referenced patents.

Also known to applicant, is U.S. Pat. No. 3,723,868 which shows a printed circuit card tester which supplies a repetitive set of waveforms to the circuit under test as a stimulus to the tested function. Digital logic circuitry performs analysis of the output from the circuit under test which consists of counting output pulses during timed intervals in order to monitor edge transitions of signals. A fault is detected when distinct edge transitions of output signals of the circuit being tested do not occur between the selected time intervals. The relevance of this patent is with respect to the way the test signals are generated and the comparison of the output test signals with the logic function signals in the testing function. However, the present invention is not dependent upon edge transition time intervals or the same features to which the patent is directed.

Also known in the prior art, is U.S. Pat. No. 3,614,608 in which a test system provides a random number signal generator to simultaneously apply a plurality of signals in a random pattern to the plurality of input pens of a circuit under test and a perfectly operating reference circuit. Comparison circuitry is responsive to signals received from both circuits and provides another signal when the two outputs are not matched. This system requires a large number of test patterns to be generated in order to provide a reliable testing process. To increase the reliability to a desired high level, a very large number of random number test patterns must be applied. The patent discloses a system whereby reliability of the testing process is approached asymptotically with an increasing number of test generator input signals. The present invention discloses a system which is a complete and certain test of the circuit under test. Because of the test performed, the combination of the test system into the LSI chip becomes desirable and is not possible in the prior art patents referenced in which test circuitry is outside of the chip.

SUMMARY OF THE INVENTION

The present application relates to an invention which is an on chip test system for LSI logic. The system consists of logic elements which typically can be placed onto the generally sparsely used area at the periphery of a LSI chip. The system reduces testing time, test data, and the number of additional mechanical connections required to dynamically test the logic functioning of individual LSI chips or logic modules constructed from groups of chips.

An important feature of the present invention is that the number of electrical contacts needed for testing chips is reduced. Another important feature is that the number of test cases or test operands that must be provided for each chip type is reduced. Additionally, the dynamic test procedure will provide for chip operation at its design clock rate. Also, the test system of the present invention is independent of the specific on chip logic functions and therefore can provide a test mechanism which is extendable to cover any number of logic modules made from any number of chips. One important aspect of having LSI chip circuitry built into the chip is that a system can be monitored without disturbing the system operation.

These features are obtained in the present invention according to this general description. At least two connection points are included on each LSI module which allows test data to be moved to and from each module serially, one bit per clock pulse. The serial data is assembled and disassembled by shift registers internal to the LSI module. The main module function under test is isolated from the surrounding connections by a set of controllable transmission gates at the input and output terminations of the logic module. These transmission gates are opened during the test procedure. A second set of transmission gates is provided between the main module function and the shift registers. These gates are closed during test at the point in time when the test data is fully assembled. Small amounts of test data can be presented to the main functional unit with the use of very few contact points in this way.

Associated with each shift register is an operand generator and result accumulator circuit. The bulk of the test cases for each LSI chip are generated on each module at full system clock rates by these generator circuits. The large number of sequential result states are compressed to a single quantity by the accumulators for a final go/no-go verification of the module or modules at the end of the test sequence. The serial input/output and control structure of this test system can be extended through many logic modules by connecting the serial test data output pin from one module to the serial test data input pin of the next. In this way, the test structure can be extended through any number of modules in a large digital system.

IN THE FIGURES

FIG. 1 is a block diagram of the components on an LSI logic module showing a test system according to the present invention.

FIGS. 2a and 2b are to be viewed in left and right order, respectively, and show a pair of LSI logic modules with an on chip test system according to the present invention and showing the testing of multiple logic modules according to the present invention where the data flow paths between the logic modules are also tested.

DESCRIPTION OF THE PREFERRED EMBODIMENTS

Figure 2B:
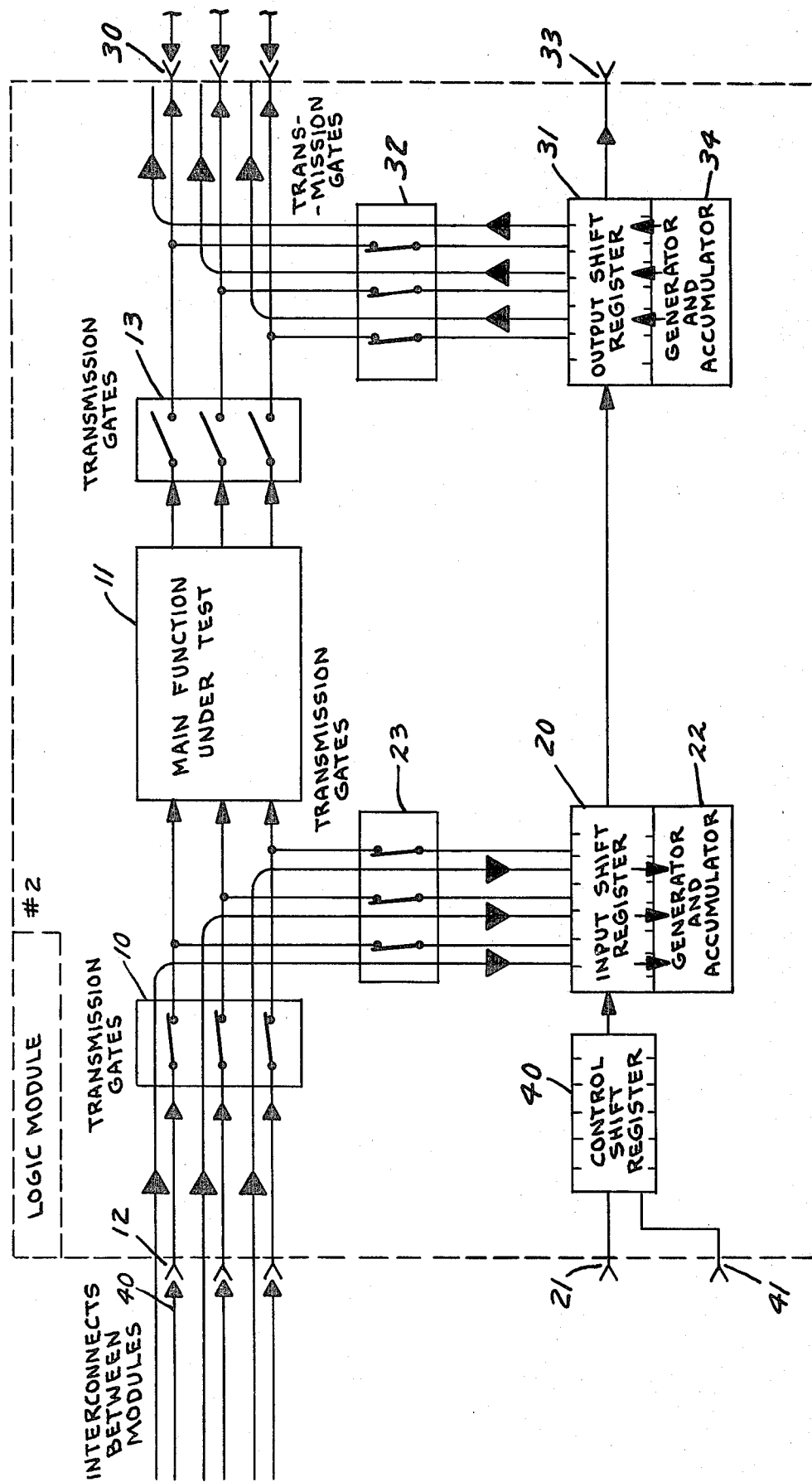

Referring now to FIG. 1, the test system according to the present invention is shown on a LSI logic module diagrammatically indicated by the dotted line. The main function inputs to the LSI chip are provided on the plurality of input lines 12. Input lines 12 are connected with a plurality of transmission gates 10 which has an individual gate for each input line. The output of the transmission gates 10 is provided to the LSI chip logic circuit 11 under test, diagrammatically illustrated. For the purpose of this invention, it is not necessary to detail the logic circuit 11. When the series transmission gates 10 are in the open condition, the main function logic circuit 11 under test is not affected by the main function inputs 12. In the same way, the main function circuit outputs are isolated by transmission gates 13 from the logic module main function outputs 30. This isolation capability allows in circuit on chip testing to take place.

Serialized test data is passed into the logic module through test data input pin 21 and is assembled in an input shift register 20. Shift register 20 has one bit position for each input connection to the logic circuit 11. The input shift register 20 is connected to the input test data through a control shift register 40, to be explained in detail later. Test data is also generated by the generator and accumulator device 22 and passed to the shift register 20. This test data is passed from the input shift register 20 to the main function circuit 11 under test by transmission gates 23.

Test results are passed from the main function outputs 30 to the output shift register 31 through transmission gates 32. The output shift register has as many bit positions as there are outputs from the logic circuit. The output shift register 31 serially transmits the test results to the test data output pin 33. Also, test results are accumulated by the generator and accumulator device 34 associated with the output shift register.

The input shift register 20 and output shift register 31 may actually be different portions of a single shift register within the scope of this invention. Both registers are bi-directional in that they may either force data or sample data.

All the transmission gates and generators and accumulators are controlled by the control shift register 40. Transmission gates can be opened or closed and accumulators can be enabled or disabled and initialized individually by discrete bits in the control shift register 40. The control shift register is loaded serially by the test data input to the test data pin 21 as a trailer to the serial test data. Control transition timing is provided by the test control input pin 41.

When the system is operated in a normal system operation function with the test circuitry inactive, normal data flows through closed transmission gates 10 from the main function inputs 12 to the main function circuit 11. Output data states flow through closed transmission gates 13 to main output terminals 30. Transmission gates 23 and 32 remain in an open condition, blocking data flow to or from the shift registers 20 and 31, respectively.

The test system according to the present invention may be used to monitor normal system operation with the proper setting of transmission gates and the proper inputs. In the monitoring system operation, transmission gates 10, 23, 32 and 13 are all in the closed position for data flow. Normal data transfers take place through transmission gates 10 and 13 to provide normal system operation and output at the main function output terminals 30. In addition, the states of all the input and output signal lines 12 and 30, respectively, are sampled at times determined by the test control pin 41 and gated through transmission gates 23 and 32 to shift registers 20 and 31, respectively. Data sampled is serialized and shifted out the test data output pin 33 where it can be examined by logic remote from the logic module or by a remote maintenance processor. The control shift register 40 controls the timing of the shifting or serial data through the shift registers and the transmission gates so that shift registers 20 and 31 do not simultaneously shift data in a conflicting fashion.

The system according to the present invention may operate to generate test cases and accumulate test results during a dynamic test of the main module function. In this mode of operation transmission gates 10 remain in the open position while transmission gates 23, 13 and 32 are in the closed condition. Thus, normal data input from the main function input terminals 12 is prohibited and the main functional circuit 11 under test receives only input through transmission gates 23. This operation thus tests the main logic function with test data. The open transmission gates 10 provide isolation for the main functional circuit 11 from the main functional inputs. Transmission gates 23 are closed and generator and accumulator 22 is initialized and enabled. The generator generates test operands at the rate of one full operand per clock pulse and passes these test operands through transmission gates 23 to the main function circuit 11 under test. A repeatable sequence of test operands is generated by the generator and accumulator 22 using a prime irreducible polynomial cyclic code generator. This is in contrast to a random test operand generator which is not repeatable. The main function logic circuit 11 responds to these predetermined test cases and passes the test results through transmission gates 30, 13 and 32 to output shift register 31.

The test results are accumulated in generator and accumulator 34. The accumulator functions by peforming a half add of the accumulated quantity to that point in the test sequence with the new result in the test sequence. After the half add operation, the new quantity is shifted end around in the shift register by one bit position. Operands are generated and results accumulated at the full cock rate for which the module was designed. Dynamic testing of the main function of the module proceeds in this manner requiring no data transfers to or from the LSI chip until the test is complete. Upon completion of the test sequence, the accumulated result quantity in the shift register 31 is shifted serially out to the test data output pin 33 where it is transmitted to a remote maintenance processor for comparison with a predetermined acceptable test result value. Therefore, a go/no-go test condition results.

This test procedure can proceed extremely rapidly because all data manipulation occurs entirely on the LSI chip. For example, with a 50 nsec. clock, 20 million test operands can be generated, applied to the main function circuit under test, and results saved in one second. Any number of modules can be tested in a complex digital system in parallel since the test functions are contained in each LSI chip and operate independently. Electrical contact to pins 21, 41, 33 and a module clock pin, not shown, as well as power supply voltages and a ground reference are sufficient to test each LSI chip. This test is therefore independent of making input and output pin connections.

FIGS. 2a and 2b together show how a system according to the present invention can be used to check the various interconnecting elements 40 between logic modules. These include connectors, wires, printed circuit paths and chip wire bonds. The logic module outputs are isolated from the main function logic circuit 11 by transmission gates 13 being in the open position. A series of test operand cases are generated by the generator and accumulator 34. These test cases operands are gated through transmission gates 32 to output pins 30. From this location, these signals travel through the various interconnections 40 to the next LSI logic module number 2. Transmission gates 10 and 23 are closed allowing the transmitted data to pass to generator and accumulator 22. The transmitted signals are accumulated in generator and accumulator 22 by doing a half add of the accumulated quantity at that point in the test with the newly received signal results. After the half add, the resulting quantity is shifted end-around one bit position. Operands are generated, transmitted through the interconnect system and accumulated by the receiving module at the full clock rate. At the end of the test sequence, the accumulated results are compared against expected values by shifting the test data serially out of the output pin 33 to a remote maintenance processor. A bad interconnection results in an incorrect accumulator value. Interconnects are dynamically tested in this way.

If a large number of shift registers on different chips are connected in series, there is very little addressing hardware needed to move data to and from a particular chip in the loop. Data is positioned on the shift sequence corresponding to its physical position. If loops are connected in parallel there has to be addressing hardware to select which loop is to transfer data. Long serial shift paths require more time to move a particular data element to a particular chip due to the long path length than the shorter parallel paths. The answer is to use the serial shift paths and to do as much parallel testing as possible. For example, rather than load one chip at a time with test operands by shifting one operand to the desired chip location, it is much better to send test cases to many chips at a time with one serial transfer making most of the data positions in the long loop useful. The shift registers can be easily linked in any series/parallel combination.

For maintenance, the ends of the shift register loops would be connected to a data buffer. Data would be transferred between the shift registers and the buffer memory at the maximum transfer rate the shift registers would support. The contents of the buffer would then be accessed through another path by a maintenance processor which could perform many of the test and isolation functions automatically given enough intelligence and file space for test cases. The maintenance processor could also form at and control the data for transmission and communication with a remote location.

Interconnect faults, in approximate order of occurrence frequency, are open logic connections, shorts to ground, shorts to supply voltage and shorts to other logic circuits. The only group requiring a large amount of test data to isolate is the shorts between logic circuits. If it is required that any possible short between two logic circuits be isolated, then each interconnect must be held at a particular state, individually, while all others are held at the opposite state. All opens and shorts to ground or supply bus can be detected by simply loading the shift registers with all "ones", gating them to the outputs and sampling the inputs. An unexpected "zero" indicates a short to ground on that input pin or logic circuit. Repeating this for all "zeros" an unexpected "one" indicates an open or a short to supply bus. Shorts between logic circuits require many test cases to isolate exhaustively but very few to isolate the vast majority.

What is claimed is:
1. An LSI chip logic testing system adapted to be resident on an LSI chip comprising:
   an LSI chip having chip functional inputs and chip functional outputs,
   a main logic functional circuit on said chip, said circuit having main logic functional inputs and main logic functional outputs,
   first transmission gate means on said chip switchably connecting the chip functional inputs to the main logic functional inputs, second transmission gate means switchably connecting the main logic functional outputs to the chip functional outputs, input shift register means for serially receiving and sending test data and for parallel connection with the main logic functional inputs of said main logic functional circuit, first generator and accumulator means connected with said input shift register means, third transmission gate means switchably connected between said main logic functional inputs and said input shift register means, fourth transmission gate means switchably connected to the main logic functional outputs, output shift register means connected to said fourth transmission gate means for serially receiving and sending test data and for parallel connection with the main logic functional outputs of said main logic functional circuit through said fourth transmission gate means, second generator and accumulator means connected with said output shift register means, control shift register means having control paths to said first through fourth transmission gate means for controlling the switching operation thereof, said control shift register means being further connected to said input shift register, said output shift register and said first and second generators and accumulators, a test data input termination means on said chip for connection externally, said test data input termination means being connected to said control shift register means, a test control input means connected externally to said chip and connected to said control shift register means, and a test data output termination means connected externally to said chip and connected to said control shift register means.

2. The system of claim 1 wherein the chip functions in normal fashion with said first and second transmission gate means closed and said third and fourth transmission gate means open.

3. The system of claim 1 wherein a test monitoring operation is performed with said first through fourth transmission gate means closed, the main logic functional circuit operating normally, and said input and output shift registers sampling input and output operands at selected times.

4. The system of claim 1 wherein a test function is performed with said first transmission gate means open and said second through fourth transmission gate means closed and wherein said third transmission gate means is connected in the input data path between said first transmission gate means and the main logic functional circuit.

* * * * *